(12) United States Patent
Weber

(10) Patent No.: US 8,362,507 B2
(45) Date of Patent: Jan. 29, 2013

(54) OPTIC ASSEMBLY UTILIZING QUANTUM DOTS

(75) Inventor: Ronald Martin Weber, Annville, PA (US)

(73) Assignee: Tyco Electronics Corporation, Berwyn, PA (US)

(*) Notice: Subject to any disclaimer, the term of this patent is extended or adjusted under 35 U.S.C. 154(b) by 177 days.

(21) Appl. No.: 12/917,209

(22) Filed: Nov. 1, 2010

(65) Prior Publication Data

US 2012/0104437 A1 May 3, 2012

(51) Int. Cl.
*H01L 33/00* (2010.01)

(52) U.S. Cl. ............ 257/98; 257/99; 257/100; 257/451; 257/E33.001

(58) Field of Classification Search ............ 257/98, 257/99, 100, 451
See application file for complete search history.

(56) References Cited

U.S. PATENT DOCUMENTS

| | | | |
|---|---|---|---|
| 6,294,794 B1 | 9/2001 | Yoshimura et al. | |
| 6,744,960 B2 | 6/2004 | Pelka | |
| 7,054,613 B2 | 5/2006 | Smeets | |
| 7,102,152 B2 | 9/2006 | Chua et al. | |
| 7,196,354 B1 | 3/2007 | Erchak et al. | |
| 7,242,030 B2 | 7/2007 | Wang et al. | |
| 7,326,908 B2 | 2/2008 | Sargent et al. | |
| 2006/0113895 A1 | 6/2006 | Baroky et al. | |
| 2007/0001182 A1 | 1/2007 | Schardt et al. | |
| 2007/0004065 A1 | 1/2007 | Schardt et al. | |
| 2007/0025673 A1 | 2/2007 | Bose et al. | |
| 2007/0249064 A1 | 10/2007 | De La Fuente et al. | |
| 2008/0054281 A1* | 3/2008 | Narendran et al. | 257/98 |
| 2008/0315177 A1 | 12/2008 | Bose et al. | |
| 2009/0009057 A1 | 1/2009 | Lee et al. | |
| 2011/0006331 A1* | 1/2011 | Shaikevitch | 257/98 |
| 2011/0012141 A1* | 1/2011 | Le Toquin et al. | 257/89 |

FOREIGN PATENT DOCUMENTS

WO  WO2008027093 A2  3/2008
WO  WO2008060335 A1  5/2008

OTHER PUBLICATIONS

"Nanosys nanotechnology improves ordinary LED lighting"; robaid.com; Jan. 12, 2010; 2 pgs.
International Search Report, International Application No. PCT/US2011/001775, International Filing Date Oct. 19, 2011.

* cited by examiner

*Primary Examiner* — Wai Sing Louie

(57) ABSTRACT

An optic assembly is provided. The assembly includes a housing having an upstream end and a downstream end. An LED is positioned in the upstream end of the housing. The LED is configured to generate excitation light therefrom. The excitation light has a first wavelength. An optic is positioned in the downstream end of the housing. The optic is positioned remotely from the LED so that a cavity is formed between the LED and the optic. The excitation light generated from the LED passes downstream through the cavity to the optic. Quantum dots are positioned on the optic. The excitation light excites the quantum dots so that the quantum dots produce emitted light having a second wavelength that is different than the first wavelength of the excitation light.

20 Claims, 3 Drawing Sheets

OPTIC ASSEMBLY UTILIZING QUANTUM DOTS

BACKGROUND OF THE INVENTION

The subject matter described herein relates to optic assemblies and, more particularly, to optic assemblies utilizing quantum dots.

White LEDs may be produced as cool white LEDs or warm white LEDs. The warmth or coolness of an LED is expressed as a color temperature in degrees Kelvin. These white LEDs typically create the white color by using a blue LED (hereafter referred to as a cool LED) with specific combination of yellow & red phosphors in close proximity to the LED. Counterintuitively, cool white LEDs produce light at the blue end of the visible spectrum and are specified in higher color temperatures, typically in excess of 5000° K whereas, warm light LEDs produce light having a higher wavelength at the red end of the visible spectrum with corresponding lower color temperatures on the order of 2700° K. The choice to use cool white LEDs or warm white LEDs may depend on the function of the light, the environment in which the light is being installed, and/or cultural differences. For example, some cultures prefer cool light sources, whereas, in other cultures, for example, North America, warm light is more preferred. However, cool white LEDs generally have a greater efficiency than warm white LEDs. For example, cool white LEDs may be as much as 35% more efficient than warm white LEDs. Accordingly, it is desirable to have cool white LEDs that can be altered to produce warm light while maintaining the efficiency of the cool white LED.

Quantum dots are semiconductor nanocrystals on the order of 2-10 nanometers in size that alter the wavelength of light as it passes through the quantum dot. When incoming light with sufficient energy strikes a quantum dot, it temporarily displaces an electron from the valence band across a band gap into the higher adjacent conducive band creating a corresponding positively charged hole in the valence band. In this unstable state, the electron drops back to the valence band and in the process emits energy in the form of light. The specific wavelength of the reemitted light is determined from bandgap and size of the quantum dot. For example, larger quantum dots shift incoming wavelengths to lower energy light at a higher wavelength. Accordingly, a larger quantum dot shifts incoming wavelengths towards the red end of the visible spectrum. Conversely, smaller quantum dots emit higher energy light at a smaller wavelength. Smaller quantum dots shift incoming wavelengths at the blue end of the visible spectrum. As such, quantum dots may be used with lighting to adjust a color of the light emitted. In a typical example, a monochromatic blue light source such as an LED may be coated with quantum dots to adjust the energy or the wavelength of the light emitted therefrom, thereby warming the cool light.

However, quantum dots are not without their disadvantages. Particularly, quantum dots may break down and degrade when exposed to high temperatures. As such the use of quantum dots with lighting is limited to low power lights which emit a minimal amount of conducted and radiated heat. High power lights and in particular LEDs, on the other hand, are not capable of being used with quantum dots because the heat from the high power LED will quickly degrade the quantum dots.

Moreover, high power LEDs are generally cheaper and easier to manufacture as cool white LEDs. However, at the time of installation, a warm light may be desired. Because high power LEDs in close proximity to the quantum dots degrade the quantum dots, the use of quantum dots to warm the light from a high power, cool LED is not an option.

A need remains for a high power cool LED that can be warmed by quantum dots, while maintaining the efficiency of the cool LED.

SUMMARY OF THE INVENTION

In one embodiment, an optic assembly is provided. The assembly includes a housing having an upstream end and a downstream end. An LED is positioned in the upstream end of the housing. The LED is configured to generate excitation light therefrom. The excitation light has a first wavelength. An optic is positioned in the downstream end of the housing. The optic is positioned remotely from the LED so that a cavity is formed between the LED and the optic. The excitation light generated from the LED passes downstream through the cavity to the optic. Quantum dots are positioned on the optic. The excitation light excites the quantum dots so that the quantum dots produce emitted light having a second wavelength that is different than the first wavelength of the excitation light.

In another embodiment, an optic assembly is provided. The assembly includes a housing having an upstream end and a downstream end. An LED is positioned in the upstream end of the housing. The LED is configured to generate excitation light therefrom. An optic is positioned in the downstream end of the housing. The optic is positioned remotely from the LED so that a cavity is formed between the LED and the optic. The excitation light generated from the LED passes downstream through the cavity to the optic. Quantum dots are positioned on the optic. The excitation light excites the quantum dots to produce emitted light that is warmer than the excitation light.

In another embodiment, an optic assembly is provided. The assembly includes a housing having an upstream end and a downstream end. An LED is positioned in the upstream end of the housing. The LED is configured to generate excitation light therefrom. The LED has a primary optic configured to focus the excitation light. A secondary optic is positioned in the downstream end of the housing. The secondary optic is positioned remotely from the primary optic so that a cavity is formed between the primary optic and the secondary optic. The excitation light generated from the LED passes downstream through cavity to the secondary optic. Quantum dots are provided on the secondary optic. The excitation light excites the quantum dots to produce emitted light that is warmer than the excitation light.

DETAILED DESCRIPTION OF THE INVENTION

The foregoing summary, as well as the following detailed description of certain embodiments will be better understood when read in conjunction with the appended drawings. As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

As used herein, the terms "warm light" and "cool light" are defined by industry standards. In particular, "cool light" defines light having a higher blue content and, when referring to white light, the Color Corrected Temperature (CCT) is on the order of 5000K to 6500K. On the other hand, "Warm light" defines light having a higher red content and, in terms of Color Corrected Temperature is on the order of 2700K-3500K. Both warm and cool light LEDs generate white light by a proprietary mix of phosphors deposited into or in close proximity of the light emitting diode die. It should be noted that the cooler white LEDs are generally more efficient than warm light LEDs. For example, cool light LEDs may be 25-35% more efficient than warm light LEDs. The choice to install cool light or warm light may be dependant on the function of the light, the environment, culture, and/or eye sensitivity.

Figure 1:
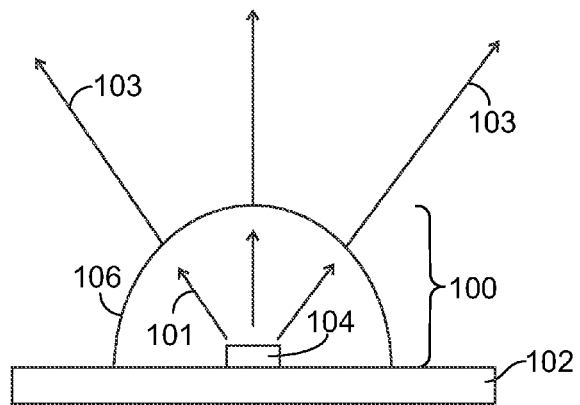
FIG. 1 is a schematic view of an LED formed in accordance with an embodiment.

FIG. 1 illustrates an LED 100 formed in accordance with an embodiment. The LED 100 may be used for such applications as general lighting, aviation lighting, automotive lighting, signals, signs, text and video displays, light bulbs, or the like. The LED 100 is electrically coupled to a substrate 102. The substrate 102 may be a circuit board, for example, a printed circuit board, a flex circuit, or the like. The substrate 102 provides power to the LED 100 so that the LED 100 emits light therefrom. The LED 100 includes a light emitting diode 104. The diode 104 is configured to generate light 101 when the LED 100 is powered through the substrate 102. In particular, movement of electrons within the diode 104 causes the diode 104 to release energy in the form of photons. The light 101 is produced by the release of energy from the diode 104. A color of the light 101 is dependant on the specific semiconductor type, construction, and amount of energy produced by the diode 104. A primary optic 106 is positioned proximate around the diode 104. The primary optic 106 protects the diode 104. The primary optic 106 may also be configured to shape the light 101 generated by the diode 104. The primary optic 106 may shape the light 101 through reflection, refraction, diffraction, or the like. The primary optic 106 may be a lens. Alternatively, the primary optic 106 may be a transparent cover.

In one embodiment, the LED 100 is a cool light LED having a blue diode. The diode 104 of the LED 100 generates light 101 at the blue end of the visible spectrum. The light generated by blue light LEDs generally has a shorter wavelength and higher energy in comparison to light generated at the red end of the visible spectrum. For example, the blue light 101 may have a wavelength between 450 nm and 500 nm. The primary optic 106 of the LED 100 may incorporate or be coated with phosphor. The phosphor causes the cool light 101 to undergo a Stokes shift, wherein a wavelength of the cool light 101 becomes longer. The light 101 generated by the diode 104 is shifted to a warmer yellow light 103. The warmer yellow light 103 is emitted from the LED 100. Alternatively, the primary optic 106 may be coated with any other suitable chemical configured to warm the cool light 101. For example, the primary optic 106 may be coated with compounds of aluminum, gallium, indium, or the like.

In one embodiment, the LED 100 is a high power LED. High power LEDs generally have an increased light output and intensity in comparison to lower power LEDs. The LED 100 may be driven at currents between hundreds of micro-Amperes to greater than one Ampere. The LED 100 may generate light at an intensity of over 1000 Lumens. In one embodiment, it may be desirable for the high power LED 100 to generate warm light at the red end of the visible spectrum. Quantum dots may be used to produce warm light. Unfortunately, quantum dots are sensitive to the high heat produced by the high power LED 100. As such, coating the LED 100 with quantum dots is not an option to produce warm light because the heat produced by the high power LED 100 will degrade the quantum dots.

Figure 2:
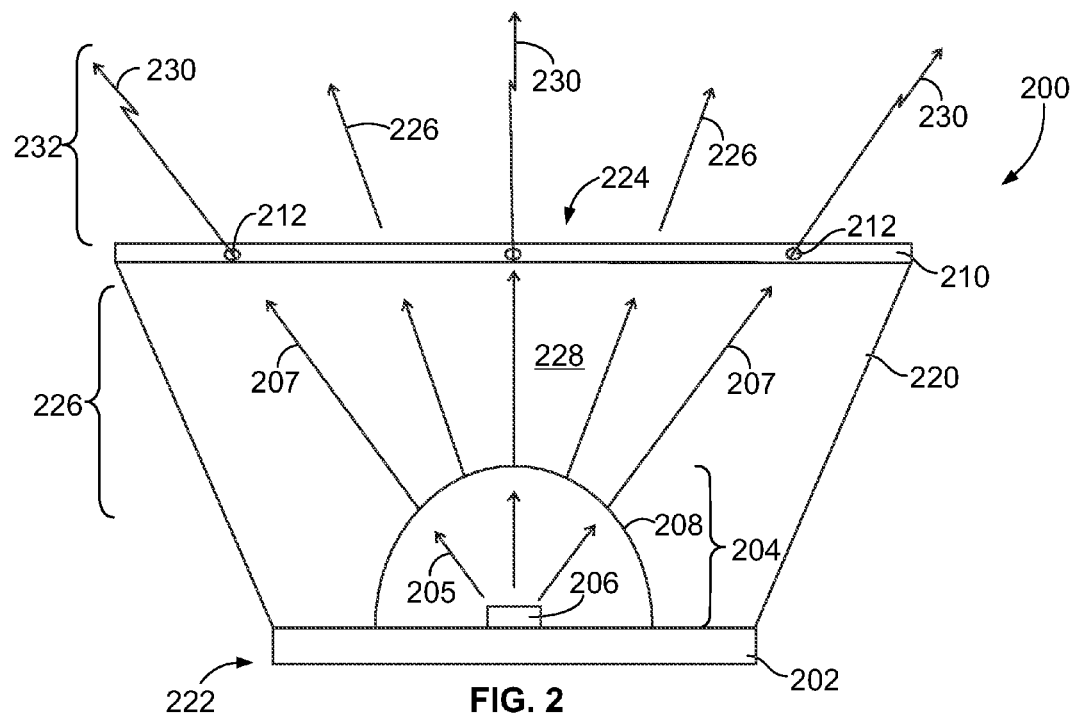
FIG. 2 is a schematic view of an optic assembly formed in accordance with an embodiment.

FIG. 2 is a schematic view of an optic assembly 200 formed in accordance with an embodiment. The optic assembly 200 is configured to produce warm light from a cool light LED. The optic assembly 200 includes a housing 220 having an upstream end 222 and a downstream end 224. A substrate 202 is positioned in the upstream end 222 of the housing 220. An LED 204 is positioned in the upstream end 222 of the housing 220 and joined to the substrate 202. The LED 204 has power through substrate 202. In one embodiment, the LED 204 may be a high power LED that is driven at currents between hundreds of micro-Amperes to greater than one Ampere and generates light at an intensity of over 1000 Lumens. In an example embodiment, the LED 204 may be a cool light LED configured to operate at efficiencies greater than an efficiency of warm light LEDs. The substrate 202 may be a circuit board, for example, a printed circuit board, a flex circuit, or the like. The substrate 202 provides power to the LED 204 so that the LED 204 generates excitation light 226. The LED 204 includes a diode 206 and a primary optic 208 covering the diode 206. In one embodiment, the LED 204 has a blue diode 206 that produces blue light 205 having high energy. The diode 206 may produce blue light 205 having a wavelength between 450 nm and 500 nm.

The primary optic 208 may include a phosphor coating to warm the blue light 205 produced by the blue diode 206. In particular, the phosphor coating creates a Stokes shift to generate yellow light 207 having a wavelength between 570 nm and 590 nm. The yellow light 207 has a lower energy and higher wavelength than the blue light 205. A density of the phosphor may be altered to alter an amount of yellow light 207 generated in the excitation light 226. A higher density of phosphor generates excitation light 226 having a wavelength closer to 590 nm. A lower density of phosphor generates excitation light 226 having a wavelength closer to 450 nm. The density of the phosphor may be altered to generate excitation light 226 from the primary optic 208 having a wavelength between 450 nm and 570 nm. The excitation light 226 generated by the LED 204 includes the yellow light 207. In one embodiment, a portion of the blue light 205 is allowed to pass through the primary optic 208. In such an embodiment, the excitation light 226 includes blue light 205 and yellow light 207. Adjusting the density and composition of the yellow phosphor to allow transmission of a portion of the blue light and emission of yellow light from the phosphor results in an emitted white light.

A secondary optic 210 is positioned in the downstream end 224 of the housing 220. The secondary optic 210 is positioned remotely from the LED 204 such that a cavity 228 is formed between the secondary optic 210 and the LED 204. The secondary optic can be a beam altering optic such as a concave, convex, or planar lens. In addition, the optic can also be of the total internal reflecting type that minimizes the size of the cavity 228 formed. In the illustrated embodiment, the secondary optic 210 is positioned remotely from the primary optic 208 so that the cavity 228 is formed between the primary optic 208 and the secondary optic 210. In an example embodiment, the secondary optic 210 may be positioned any distance from the primary optic 208 so much as the secondary optic 210 is not in contact with the LED 204. In an embodiment utilizing a total internal reflecting lens, the total internal reflecting lens may incorporate an outer lens and an inner lens with a space formed therebetween. In such an embodiment, the inner lens may be positioned directly on the LED 204. The secondary optic 210 is positioned so that the excitation light 226 travels downstream from the LED 204 through the cavity 228 to the secondary optic 210. In one embodiment, the secondary optic 210 is a clear disc. Alternatively, the secondary optic 210 may be a lens. For example, the secondary optic 210 may be a total internal reflection lens. Alternatively, the secondary optic 210 may be a refractive lens, diffractive lens and/or any other suitable lens.

The secondary optic 210 includes quantum dots 212 positioned thereon. The quantum dots 212 are semiconductor nanocrystals formed in a colloidal solution. Excitons of the quantum dots 212 are confined in all three spatial dimensions so that excitation of the quantum dots 212 produces emitted light 230. The quantum dots 212 may produce emitted light 230 from the visible spectrum to the infrared spectrum. The size of the quantum dots 212 may range from 5 nm to 50 nm. Smaller quantum dots 212 require a greater amount of energy to excite. Accordingly, the smaller quantum dots 212 release a higher amount of energy. The higher amount of energy produces emitted light 230 near the blue end of the visible spectrum having a wavelength between 450 nm and 500 nm. Larger quantum dots 212 require less energy to excite. Accordingly, larger quantum dots 212 release less energy. The lower amount of energy produces emitted light 230 at the red end of the visible spectrum having a wavelength between 610 nm and 760 nm. The size of the quantum dots may be selected based on a predetermined color of emitted light 230 that the quantum dots are to produce.

In one embodiment, the secondary optic 210 is coated with the quantum dots 212. For example, the quantum dots 212 may be process impregnated into secondary optic 210 in an even distribution throughout the optic. In another embodiment, the quantum dots 212 are provided in a laminate layer that is applied to the primary and/or secondary surfaces of secondary optic 210. In an example embodiment, the quantum dots 212 are sized to produce lower energy, high wavelength emitted light 230 at the red end of the visible spectrum having a wavelength between 610 nm and 760 nm. A density of the quantum dots 212 on the secondary optic 210 may also be altered to alter a wavelength of the emitted light 230 emitted by the quantum dots 212. For example, a high density of quantum dots 212 produces emitted light 230 having a wavelength closer to 760 nm and a low density of quantum dots 212 produces emitted light 230 having a wavelength closer to 610 nm.

During operation, the diode 206 of the LED 204 produces blue light 205 at the blue end of the visible spectrum and having a wavelength between 450 nm and 500 nm. The blue light 205 passes through the primary optic 208. In one embodiment, the primary optic 208 is coated with phosphor. It should be noted that coating the primary optic 208 with phosphor is exemplary only. In other embodiments, the primary optic 208 may be coated with other compounds. The phosphor causes the blue light 205 to undergo a Stokes shift so that the wavelength of the blue light 205 is increased to form a warmer yellow light 207 having a wavelength between 570 nm and 590 nm. The amount of warmer yellow light 207 generated by the primary optic 208 may be dependant on a density of the phosphor. For example, a higher density of phosphor may produce yellow light 207 having a wavelength closer to 590 nm. A lower density of phosphor may produce yellow light 207 having a wavelength closer to 450 nm. In one embodiment, the primary optic allows some of the blue light 205 to pass therethrough. The blue light 205 is emitted from the LED 204 with the warm yellow light 207 to generate excitation light 226 having a first wavelength within the range of the blue and yellow colors of the visible spectrum. The amount of blue light 205 allowed to pass through the primary optic 208 may be altered so that the LED 204 generates excitation light 226 having a first wavelength between 450 nm and 590 nm. In one embodiment, the excitation light 226 includes only the yellow light 207. In another embodiment, the primary optic 208 is not coated with phosphor and the excitation light 226 includes only the blue light 205. Alternatively, the primary optic 208 may be coated with other chemicals compounds to produce different colored light. For example, the primary optic 208 may be coated with compounds such as, aluminum, gallium, indium, or the like.

The excitation light 226 is directed downstream through the cavity 228 to the secondary optic 210. The excitation light 226 is configured to excite the quantum dots 212 provided on the secondary optic 210. The quantum dots 212 produce the emitted light 230. The quantum dots 212 are configured to emit low energy, long wavelength emitted light 230 therefrom. In an example embodiment, a second wavelength of the emitted light 230 is greater than the first wavelength of the excitation light 226. The emitted light 230 may have a second wavelength at the red end of the visible spectrum. For example, the emitted light 230 may have a second wavelength between 610 nm and 760 nm. Alternatively, the quantum dots 212 may be configured to emit light 230 having any second wavelength greater than the first wavelength of the excitation light 226. For example, the second wavelength of the emitted light 230 may be between 590 nm and 760 nm. The emitted light 230 is warmer than the excitation light 226.

In one embodiment, the density of the quantum dots 212 may be altered to allow a portion 209 of the excitation light 226 to pass through the secondary optic 210. The portion 209 of the excitation light 226 passes through the secondary optic 210 along with the emitted light 230 to alter a warmth of the total light 232 emitted by the optic assembly 200. For example, a high density of quantum dots 212 may restrict the excitation light 226 from passing through the secondary optic 210 thereby producing a total light 232 having a wavelength at the red end of the visible spectrum between 610 nm and 760. A lower density of quantum dots 212 may enable some of the excitation light 226 to pass through the secondary optic 210 so that the total light 232 produced by the optic assembly 200 is closer to yellow on the visible spectrum. The density and composition of the quantum dots 212 may be altered to produce total light 232 from the optic assembly 200 having wavelengths between 590 nm and 760 nm. Through the composition of the quantum dots and wavelength of the excitation light 226, a wide variety of white light color temperatures from 2700 K to 6500 K can be created.

The optic assembly 200 produces warm white light from a cool white light LED 204. The optic assembly 200 produces warm white light while maintaining the efficiency of the cool light LED 204. The secondary optic 210 can be positioned within the optic assembly 200 at the time of assembly. Accordingly, the optic assembly 200 can be manufactured and shipped as a cool LED. Various versions of secondary optic 210 can be offered to provide varying degrees of coolness or warmness when applied to assembly 200. At the time of assembly or end fixture installation, the desired secondary optic 210 can be added to the optic assembly 200 to produce a cooler or warmer light from the optic assembly 200. As such, the decision to install the optic assembly 200 as a cool light LED or a warm light LED can be made at the point of installation during assembly. The need to manufacture and ship separate cool or warm light LEDs is thereby eliminated.

Moreover, the secondary optic 210 enables the quantum dots 212 to be utilized with high power LEDs. The secondary optic 210 is positioned a distance from the LED 204 so that the quantum dots 212 are not exposed to the heat generated by the high power LED 204. In one embodiment, the secondary optic 210 need only be positioned so that the secondary optic 210 does not contact the high power LED 204. Alternatively, the secondary optic 210 may be positioned any suitable distance from the LED 204 so that the quantum dots 212 are excited by the excitation light 226 emitted from the LED 204. Positioning the secondary optic 210 remotely from the LED 204 prevents the degradation of the quantum dots 212 provided on the secondary optic 210.

Figure 3:
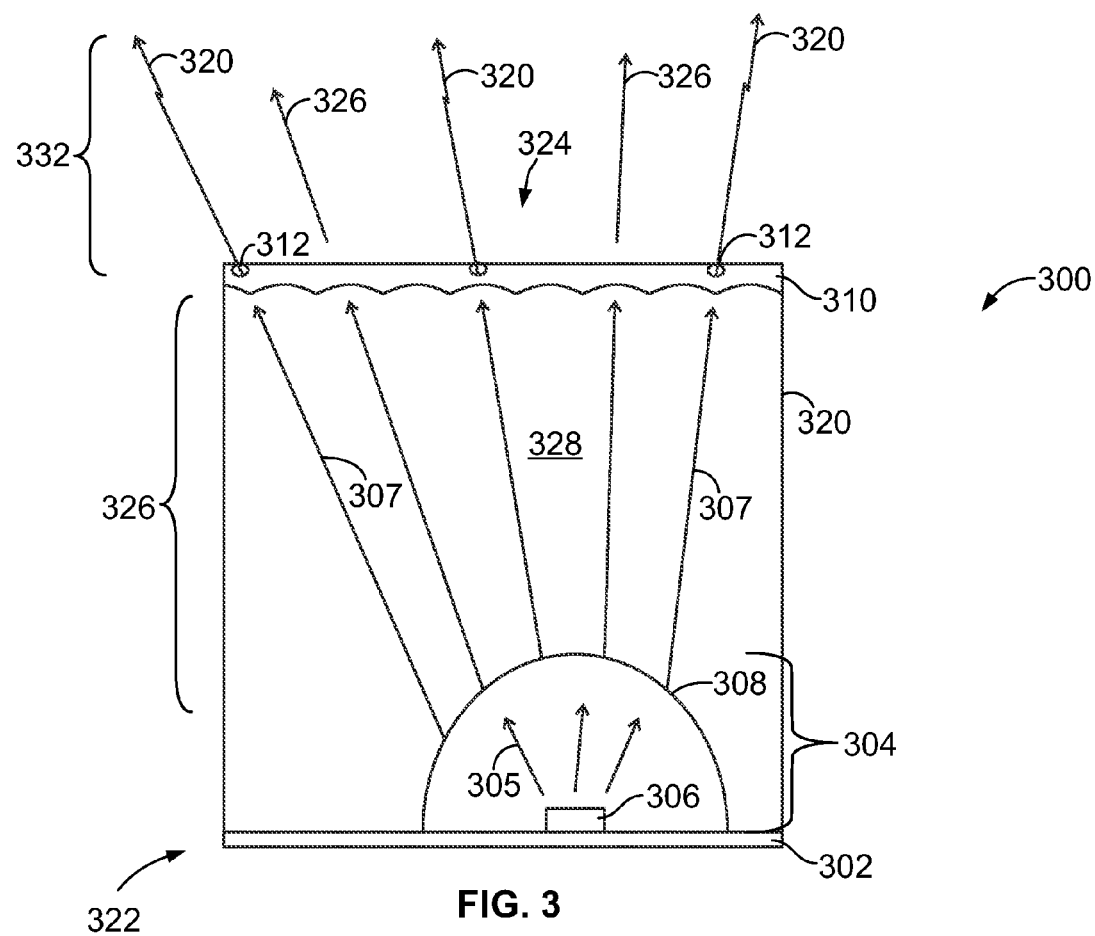
FIG. 3 is a schematic view of an optic assembly formed in accordance with another embodiment.

FIG. 3 is a schematic view of an optic assembly 300 formed in accordance with an embodiment. The optic assembly 300 includes a housing 320 having an upstream end 322 and a downstream end 324. The optic assembly 300 is configured to produce warm light from a cool white light LED. The optic assembly 300 includes a substrate 302 positioned in the upstream end 322 of the housing 320. An LED 304 is positioned in the upstream end 322 of the housing 320 and joined to the substrate 302. The LED 304 has power. In one embodiment, the LED 304 may be a high power LED. In one embodiment, the LED 304 may be a cool light LED. The LED 304 is configured to generate excitation light 326. The LED 304 includes a diode 306 and a primary optic 308 covering the diode 306. In one embodiment, the LED 304 has a blue diode 306 that produces substantially monochromatic cool light 305 having a wavelength between 450 nm and 500 nm. The primary optic 308 may include a phosphor coating to warm the cool light 305 emitted from the blue diode 306 which when combined with the yellow phosphor produces a cool white light 307. In an example embodiment, the excitation light 326 includes the yellow light 307 and a portion of the cool blue light 305. The density of the phosphor may be altered to alter an amount of yellow light 307 and cool light 305 within the excitation light 326.

A secondary optic 310 is positioned in the downstream end 324 of the housing 320. The secondary optic 310 is positioned remotely from the LED 304 so that a cavity 328 is defined between the secondary optic 310 and the LED 304. The secondary optic 310 is positioned remotely from the primary optic 308 so that the cavity 328 is defined between the secondary optic 310 and the primary optic 308. In an example embodiment, the secondary optic 310 may be positioned any distance from the primary optic 308 so much as the secondary optic 310 is not in contact with the LED 304. The secondary optic 310 is positioned so that the excitation light 326 generated by the LED 304 travels downstream through the cavity 328 to the secondary optic 310. In the illustrated embodiment, the secondary optic 310 is a microlens. The microlens may include a plurality of microlenses joined together in a one-dimensional or two-dimensional array. In one embodiment, the microlenses may be arranged in a hexagonal array. The microlenses may have a diameter that is less than one millimeter. In one embodiment, the microlenses may have a diameter as small as 10 micrometers. In one embodiment, the microlens is a gradient-index lens, a micro-Fresnel lens, or the like. The microlens may be utilized to focus the excitation light 326 that passes therethrough. The microlens may focus the excitation light 326 through reflection, refraction, diffraction, or the like.

The secondary optic 310 includes quantum dots 312 positioned thereon or therein. In one embodiment, the secondary optic 310 is coated with the quantum dots 312. For example, the quantum dots 312 may be lithographed, photo-etched, or applied by a number of other commonly accepted printing methods onto the secondary optic 310. Quantum dots may be applied to either the first or second surface of the secondary optic. Alternately, they may also be incorporated into the material forming the secondary optic. In another embodiment, the quantum dots 312 are provided in a laminate layer that is adhered to the secondary optic 310. The excitation light 326 excites the quantum dots 312 so that the quantum dots 312 produce emitted light 330. The size of the quantum dots 312 determines a wavelength of the emitted light 330. In an example embodiment, the quantum dots 312 are sized to produce lower energy, high wavelength emitted light 330 at the red end of the visible spectrum having a wavelength between 610 nm and 760 nm. A density of the quantum dots 312 on the secondary optic 310 may be altered to alter a wavelength of the emitted light 330.

During operation, the diode 306 of the LED 304 emits cool light 305 at the blue end of the visible spectrum and having a wavelength between 450 nm and 500 nm. The cool light 305 passes through the primary optic 308. In one embodiment, the primary optic 308 is coated with or incorporates phosphor. The phosphor shifts the cool light 305 and emits a warmer yellow light 307 having a wavelength between 570 nm and 590 nm. In one embodiment, the primary optic allows some of the cool light 305 to pass therethrough. The cool light 305 is emitted with the warmer yellow light 307 to generate excitation light 326 having a first wavelength within the range of the blue and yellow colors of the visible spectrum with the resultant light appearing white. In another embodiment, the primary optic 308 is not coated with phosphor and the cool light 305 is enabled to pass therethrough unaltered such that the excitation light 326 includes only cool blue light 305. In another embodiment, the excitation light 326 includes only yellow light 307. Alternatively, the primary optic 308 may be coated with chemicals compounds other than phosphor to produce different colored light.

The excitation light 326 excites the quantum dots 312 on the secondary optic 310 so that the quantum dots 312 produce emitted light 330. The emitted light 330 has a low energy and a high second wavelength. The emitted light 330 may have a second wavelength at the red end of the visible spectrum. The emitted light 330 has a second wavelength that is greater than a first wavelength of the excitation light 326. The emitted light 330 is warmer than the excitation light 326. In one embodiment, the density of the quantum dots 312 may be altered to allow a portion 309 of the excitation light 326 to pass through the secondary optic 310. The portion 309 of the excitation light 326 that passes through the secondary optic 310 is emitted from the optic assembly 300 with the emitted light 330 as the total light 332 from the optic assembly 300. The portion 309 of excitation light 326 passing through the secondary optic 310 alters a warmth of the total light 332 emitted by the optic assembly 300. The density of the quantum dots 312 may be altered to produce total light 332 from the optic assembly 300 having wavelengths between 590 nm and 760 nm.

The optic assembly 300 produces warm light from a cool light LED 304. The optic assembly 300 produces warm light while maintaining the efficiency of the cool light LED 304. The secondary optic 310 can be positioned within the optic assembly 300 at the time of assembly. Accordingly, the optic assembly 300 can be manufactured and shipped as a cool light LED. At the time of assembly, the secondary optic 310 can be added to the optic assembly 300 to produce warm light from the optic assembly 300. As such, the decision to install the optic assembly 300 as a cool light LED or a warm light LED can be made at the point of installation during assembly. The need to manufacture and ship warm light LEDs is thereby eliminated.

Moreover, the secondary optic 310 enables the quantum dots 312 to be utilized with high power LEDs. The secondary optic 310 is positioned a distance from the LED 304 so that the quantum dots 312 are not exposed to the heat generated by the high power LED 304. In one embodiment, the secondary optic 310 need only be positioned so that the secondary optic 310 does not contact the high power LED 304. Alternatively, the secondary optic 310 may be positioned any suitable distance from the LED 304 so that the quantum dots 312 are excited by the excitation light 326 emitted from the LED 304. Positioning the secondary optic 310 remotely from the LED 304 prevents the degradation of the quantum dots 312 provided on the secondary optic 310.

Figure 4:
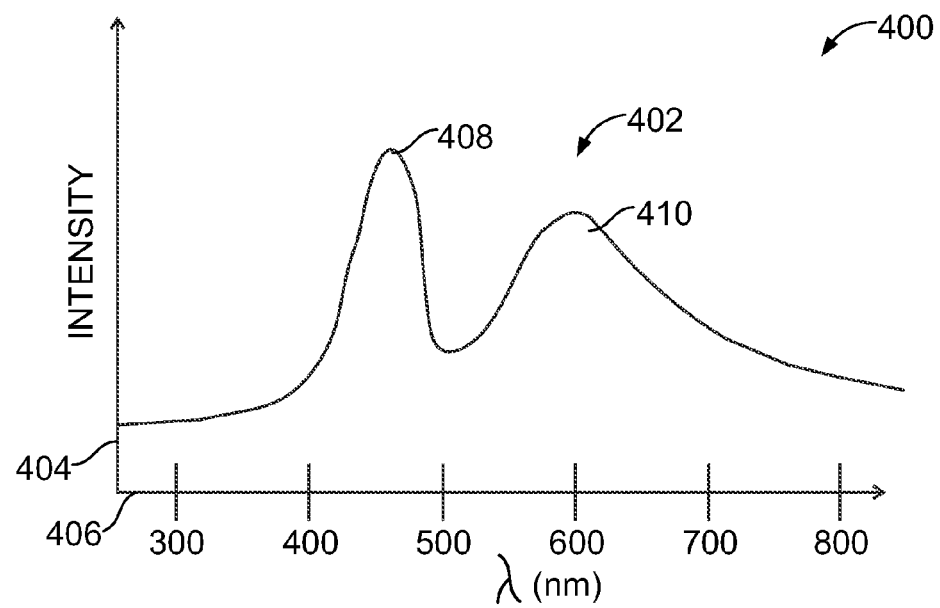
FIG. 4 is a graph illustrating a color spectrum of light from an LED formed in accordance with an embodiment.

FIG. 4 is a graph 400 illustrating a color spectrum 402 of total light from an LED formed in accordance with an embodiment. The graph 400 represents a color spectrum 402 from a cool light LED having a blue diode and a phosphor coating. For example, the graph 400 may represent a color spectrum 402 of total light from an LED such as the LED 100 shown in FIG. 1. The graph 400 represents an intensity of light on the y-axis 404 and a wavelength of the light on the x-axis 406. The color spectrum 402 includes a first peak 408 and a second peak 410. The peaks 408 and 410 represent wavelengths of light having a high intensity. The first peak 408 occurs at a wavelength between 450 nm and 500 nm. The first peak 408 represents the cool blue excitation light emitted by the blue diode. The second peak 410 at occurs at a wavelength between 570 nm and 590 nm. The second peak 410 represents yellow excitation light emitted by the phosphor coating. The graph 400 illustrates a color spectrum 402 from an LED emitting total light having blue and yellow excitation light. The yellow excitation light warms the blue excitation light emitted by the diode to generate warmer total light from the cool light LED.

Figure 5:
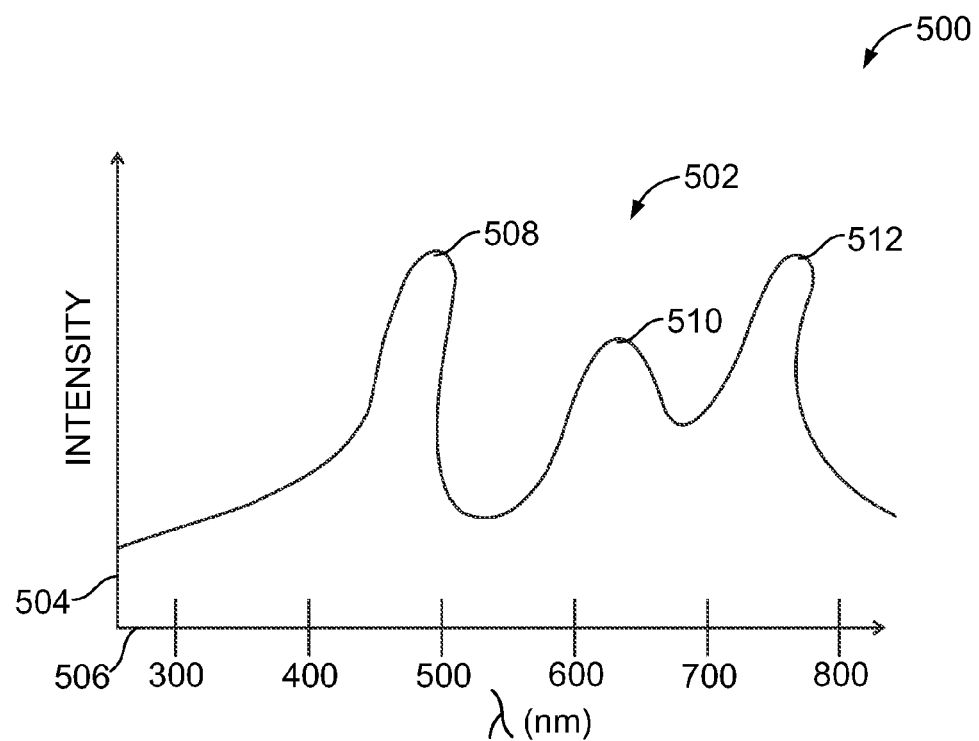
FIG. 5 is a graph illustrating a color spectrum of light from an LED formed in accordance with another embodiment.

FIG. 5 is a graph 500 illustrating a color spectrum 502 of total light from an LED formed in accordance with an embodiment. The graph 500 represents a color spectrum 502 from a cool light LED having a blue diode, a phosphor coating, and a secondary optic containing quantum dots. For example, the graph 500 may represent a color spectrum 502 of total light from an LED such as the LEDs 200 and 300 shown in FIGS. 2 and 3, respectively. The graph 500 represents an intensity of light on the y-axis 504 and a wavelength of the light on the x-axis 506. The color spectrum 502 includes a first peak 508, a second peak 510, and a third peak 512. The peaks 508, 510, and 512 represent wavelengths of light having a high intensity. The first peak 508 occurs at a wavelength between 450 nm and 500 nm. The first peak 508 represents the cool blue excitation light emitted by the blue diode. The second peak 510 at occurs at a wavelength between 570 nm and 590 nm. The second peak 510 represents yellow excitation light emitted by the phosphor coating. The third peak 512 occurs at a wavelength between 610 nm and 760 nm. The third peak 512 represents red emitted light emitted from the quantum dots on the secondary optic. The graph 500 illustrates a color spectrum 502 from an LED producing total light having blue and yellow excitation light and red emitted light. The yellow excitation light warms the blue excitation light emitted by the diode to generate warmer excitation light from the cool light LED. The red emitted light further warms the excitation light emitted by the LED to produce warm total light having wavelengths closer to the red end of the visible spectrum. With the addition of the red emitted light, the color spectrum represented in FIG. 5 produces a warmer total light than the color spectrum illustrated in FIG. 4.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the invention without departing from their scope. While the dimensions and types of materials described herein are intended to define the parameters of the various embodiments of the invention, the embodiments are by no means limiting and are exemplary embodiments. Many other embodiments will be apparent to those of skill in the art upon reviewing the above description. The scope of the various embodiments of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments of the invention, including the best mode, and also to enable any person skilled in the art to practice the various embodiments of the invention, including making and using any devices or systems and performing any incorporated methods. The patentable scope of the various embodiments of the invention is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. An optic assembly comprising:
   a housing having an upstream end and a downstream end;
   an LED positioned in the upstream end of the housing, the LED configured to generate excitation light therefrom, the excitation light having a first wavelength;
   an optic positioned in the downstream end of the housing, the optic configured as a beam altering optic and comprising at least one of the concave lens, convex lens, planar lens, or microlens, the optic positioned remotely from the LED so that a cavity is formed between the LED and the optic, the excitation light generated from the LED passing downstream through the cavity to the optic; and
   quantum dots process impregnated into the optic, the excitation light exciting the quantum dots so that the quantum dots produce emitted light having a second wavelength that is different than the first wavelength of the excitation light.

2. The optic assembly of claim 1, wherein the emitted light is warmer than the excitation light.

3. The optic assembly of claim 1, wherein the second wavelength of the emitted light is longer than the first wavelength of the excitation light.

4. The optic assembly of claim 1, wherein the optic is positioned a distance from the LED, the distance configured to prevent thermal degradation of the quantum dots.

5. The optic assembly of claim 1, wherein the optic comprises an array of microlenses.

6. The optic assembly of claim 1, wherein the optic is configured to allow a portion of the excitation light to pass through the optic so that a total light emitted from the optic assembly has a warmth that is altered from the emitted light from the quantum dots.

7. The optic assembly of claim 6, wherein the emitted light from the quantum dots has a wavelength at the red end of the visible spectrum and the total light has a wavelength that is closer to yellow on the visible spectrum.

8. The optic assembly of claim 1, wherein the LED is a cool light LED.

9. An optic assembly comprising:
   a housing having an upstream end and a downstream end;
   an LED positioned in the upstream end of the housing, the LED configured to generate excitation light therefrom;
   an optic positioned in the downstream end of the housing, the optic configured as a beam altering optic and comprising at least one of a concave lens, convex lens, planar lens, or microlens, the optic positioned remotely from the LED so that a cavity is formed between the LED and the optic, the excitation light generated from the LED passing downstream through the cavity to the optic; and
   quantum dots process impregnated into the optic, the excitation light exciting the quantum dots to produce emitted light that is warmer than the excitation light.

10. The optic assembly of claim 9, wherein the excitation light has a first wavelength that is shorter than a second wavelength of the emitted light.

11. The optic assembly of claim 9, wherein the optic is positioned a distance from the LED, the distance configured to prevent thermal degradation of the quantum dots.

12. The optic assembly of claim 9, wherein the optic comprises an array of microlenses.

13. The optic assembly of claim 9, wherein the optic is configured to allow a portion of the excitation light to pass through the optic so that a total light emitted from the optic assembly has a warmth that is altered from the emitted light from the quantum dots.

14. The optic assembly of claim 13, wherein the emitted light from the quantum dots has a wavelength at the red end of the visible spectrum and the total light has a wavelength that is closer to yellow on the visible spectrum.

15. The optic assembly of claim 9, wherein the LED is a cool light LED.

16. An optic assembly comprising:
   a housing having an upstream end and a downstream end;
   an LED positioned in the upstream end of the housing, the LED configured to generate excitation light therefrom, the LED having a primary optic configured to focus the excitation light;
   a secondary optic positioned in the downstream end of the housing, the secondary optic comprising at least one of a transparent disc, concave lens, convex lens, planar lens, or microlens, the secondary optic positioned remotely from the primary optic so that a cavity is formed between the primary optic and the secondary optic, the excitation light generated from the LED passing downstream through the cavity to the secondary optic; and
   quantum dots process impregnated into the secondary optic, the excitation light exciting the quantum dots to produce emitted light that is warmer than the excitation light.

17. The optic assembly of claim 16, wherein the excitation light has a first wavelength that is shorter than a second wavelength of the emitted light.

18. The optic assembly of claim 16, wherein the secondary optic is positioned a distance from the LED, the distance configured to prevent thermal degradation of the quantum dots.

19. The optic assembly of claim 16, wherein the secondary optic comprises an array of microlenses.

20. The optic assembly of claim 16, wherein the secondary optic is configured to allow a portion of the excitation light to pass through the secondary optic so that a total light emitted from the optic assembly has a warmth that is altered from the emitted light from the quantum dots.

* * * * *